(12) United States Patent
Haley et al.

(10) Patent No.: US 6,306,746 B1
(45) Date of Patent: Oct. 23, 2001

(54) BACKEND PROCESS FOR FUSE LINK OPENING

(75) Inventors: Mark W. Haley, Rio Medina; Todd Mitchell, San Antonio, both of TX (US)

(73) Assignee: Koninklijke Philips Electronics, Eindhoven (NL)

(*) Notice: Subject to any disclaimer, the term of this patent is extended or adjusted under 35 U.S.C. 154(b) by 0 days.

(21) Appl. No.: 09/475,698

(22) Filed: Dec. 30, 1999

(51) Int. Cl.[7] .................................................. H01L 21/44
(52) U.S. Cl. ........................... 438/601; 438/132; 257/529
(58) Field of Search ............................ 257/529; 438/128, 438/132, 597, 598, 601

(56) References Cited

U.S. PATENT DOCUMENTS

| | | | |
|---|---|---|---|
| 4,455,194 | * | 6/1984 | Yabu et al. ............................ 438/601 |
| 4,628,590 | * | 12/1986 | Udo et al. ............................... 438/6 |
| 5,585,662 | | 12/1996 | Ogawa .................................. 257/529 |
| 5,821,160 | * | 10/1998 | Rodriguez et al. .................... 438/601 |
| 5,955,380 | * | 9/1999 | Lee ....................................... 438/706 |

FOREIGN PATENT DOCUMENTS

| | | |
|---|---|---|
| 2 330 592 | 4/1999 | (GB). |
| 58-023475 | 3/1983 | (JP). |
| 11-067054 | 3/1999 | (JP). |

* cited by examiner

*Primary Examiner*—Amir Zarabian
*Assistant Examiner*—Christian D. Wilson

(57) ABSTRACT

The present invention is directed to a method of forming an insulative layer over a fuse link in a semiconductor device that is sufficiently thick to encapsulate the fuse link during laser opening, thereby preventing vaporized metal from re-depositing on the fuse link. The layer is also sufficiently thin to allow the laser to penetrate the insulative layer during laser opening of the fuse. A primary dielectric layer is formed over a metal fuse link, the primary dielectric having a predetermined deposition thickness over the fuse link. The primary dielectric layer is then covered with an etch interrupting layer. The etch interrupting layer is covered with a secondary dielectric layer and a portion of the secondary dielectric layer is then removed, resulting in an interlayer dielectric (ILD) stack formed from the etch interrupting layer and the remaining secondary dielectric layer. The ILD has a selected thickness that is greater than the thickness of the primary dielectric layer. A metal layer is formed over the interlayer dielectric and then the layers over the etch interrupting layer and above the metal fuse link are then removed. Finally, the etch interrupting layer is removed from above the primary dielectric layer so as to expose a portion of the primary dielectric layer disposed above the metal fuse link.

20 Claims, 4 Drawing Sheets

BACKEND PROCESS FOR FUSE LINK OPENING

FIELD OF THE INVENTION

This invention relates to the manufacture of semiconductor devices such as transistors, diodes and integrated circuits. More specifically, this invention relates to a process for forming fuses in integrated circuits.

BACKGROUND OF THE INVENTION

Semiconductor memories are becoming increasing dense; in terms of the number of bits, a single memory chip is approaching the gigabit range. Concurrent with the increase in memory capacity, the dimensions of the circuit components are decreasing. Consequently, the push for more capacity in a smaller space puts pressure on maintaining yield and reducing cost.

One approach to improving yield and cost factors involves the use of built-in redundancy cells for replacement of memory arrays. During testing, if a defective cell is found, one of the built-in redundancy cells is configured to replace it. In one well-known process, fuses are used to provide such redundancy in semiconductor memories. If a semiconductor memory is found to have a small number of defective bits, these defects can be effectively overcome by exchanging the cells containing the faulty bit locations with spare cells especially designed for this purpose. The addresses of the cell(s) exchanged, as provided by a designated row and column address, are programmed into the memory circuitry during test. This is commonly done by opening (e.g., by "blowing" open the fuses) a number of fuses in a special section of the circuit. The fuses can be opened electrically, but it is usually more convenient to open them by subjecting the fuse to a high-intensity focused laser beam on a special probing system.

Any conductive material can be potentially used for the fusible element. For ease of incorporation into an existing integrated circuit, polysilicon, which is also commonly used for the gate electrode, is used for the fusible element. The polysilicon may be N-type or P-type depending upon the polarity of the transistor structure. A metal layer is also often used for the fusible element due its lower inherent resistance, which allows for faster reading of the fuse and, therefore, faster memory access. The particular composition of the metal depends upon the process. For example, a "metal" in a modern sub-micron process may be a "sandwich" of layers. The bottom layer has about 200 Å of titanium, a middle layer of 5000 Å of an aluminum/copper alloy and a top layer of about 300 Å of titanium nitride. Depending on the specifics of the process, other types of alloys and configurations may be used. When the fuse is opened with the laser beam, a great deal of energy is transferred into the fuse, causing a rapid rise in temperature and vaporization of at least part of the fuse. The force of the blast forcibly expels vaporized parts of the fuse. In this way, the fuse changes from a conductive link to a non-conductive link. The ease and reproducibility of blowing the fuse in this manner and the reliability of the fuse element once blown are all strongly dependent on the material covering the fuse.

In a conventional integrated circuit, the levels of metal that form the interconnect layers are each embedded in some form of deposited silicon dioxide to guarantee good electrical isolation between the conductors. The upper-most insulating layer, on top of the upper-most metal layer in the integrated circuit, also serves as a "passivation" layer. The passivation layer acts to protect the delicate integrated circuit from both mechanical damage and from the entry of foreign material (such as moisture or ionic contaminants) that might compromise the long-term reliability of the circuit. More commonly, the passivation layer on modern integrated circuits consists of a nitride layer deposited on the oxide layer in the circuit. The nitride layer is used because of its mechanical strength and its impermeability to moisture and ionic contaminants.

In an example prior art process, a semiconductor device is formed on a wafer substrate beginning with an insulating layer being deposited thereon. This insulating layer is typically silicon dioxide, however, other insulators may also be used. Examples of insulating materials include silicon dioxide, silicon oxynitride, silicon oxyfluoride, silicon nitride, other oxides and nitrides, amorphous carbon, spin-on glasses (such as silicates, siloxanes, hydrogen silsesquioxane, and alkyl silsesquioxanes), polymers (such as polyimides and fluoropolymers), and other nonconductive materials.

Photolithography and etching processes are often used to form a fuse layer along with other conductive interconnects (e.g., component-to-component connection within the IC). Such conductive materials may include doped polysilicon or metal alloys of aluminum, copper, or others. The geometry of the fuse or fusible element is not limited to any particular form; instead the form is governed by the needs of the process and the application. Chip designers are able to design varying-valued resistor structures by patterning layers in a variety of different shapes designed to fit well within a particular design layout. By way of example, the resistance "R" of a patterned shape is determined by multiplying the ratio of ("length"/"width") by the resistivity expressed in terms of sheet resistance.

For the design of reliable and reproducible fuses, the top passivation layer of the integrated circuit is often a major consideration. For fuse optimization, avoiding use of a nitride film on top of the conductive film of the fuse is advantageous because the mechanical robustness of the nitride film tends to resist the vaporization of the fuse material, making it hard to blow the fuse. If sufficient energy is coupled into the fuse to overcome this resistance, the vaporization of the fuse is more explosive, and may tend to damage nearby circuit elements. For this reason, it is usually preferable to remove the nitride layer in the immediate region over the fuse. Some implementations choose to remove the nitride layer, but leave a layer of silicon dioxide on top of the fuse to improve the integrity of the protective seal on top of the integrated circuit. Because the majority of the fuses in any memory will not be blown, it is desirable that they remain covered with a protective layer of oxide in order to provide a degree of mechanical and chemical protection.

Another reason for leaving some of the silicon dioxide relates to the reliability of fuse blowing. If there is no encapsulating layer on top of the fuse trying to contain the vaporized metal, the fuse can be melted and blown with a relatively small amount of laser energy. If the fuse is blown in this way, the vaporized metal may not be forcibly expelled and may be redeposited in the vicinity of the remaining fuse body. Over time, this type of structure may tend to become more conductive and pose a reliability risk to the functionality of the circuit. There is a need to develop a fuse link that can be opened with precision and reliability and that can be formed using conventional manufacturing processes.

SUMMARY OF THE INVENTION

The present invention is directed to the formation of an insulative layer over a fuse link in a semiconductor device, with the insulative layer being sufficiently thick to encapsulate the fuse body during laser opening and prevent vaporized metal from re-depositing on the fuse body. The insulative layer is also sufficiently thin to allow the laser to penetrate the insulative layer during laser opening of the fuse. The present invention also provides a method of removing an ILD (interlayer dielectric) over the fuse with some precision by first forming the oxide layer over the fuse with a necessary thickness, in relation to the wavelength of the laser light beam used in the manufacturing process, before the other layers of the ILD are formed. This advantageously permits for selective etching to remove the upper layers of the ILD until the oxide layer above the fuse is exposed. Further etching is not required since the thickness of the oxide layer above the fuse link was determined at the onset.

An example embodiment of the present invention is directed to a method for making a semiconductor device that includes a substrate, an insulative layer disposed on the substrate and a metal fuse link disposed on the insulative layer. A primary dielectric layer is then provided over the metal fuse link, with the primary dielectric layer having a predetermined deposition thickness over the fuse link. The primary dielectric layer is then covered with an etch interrupting layer and the etch interrupting layer is then covered with a secondary dielectric layer. A portion of the secondary dielectric layer is then removed, and the etch interrupting layer and the remaining secondary dielectric layer form an interlayer dielectric having a selected thickness that is greater than the thickness of the primary dielectric layer. A metal layer is formed over the interlayer dielectric and then the layers over the etch interrupting layer and above the metal fuse link are removed. Finally, the etch interrupting layer over the primary dielectric layer is removed and a portion of the primary dielectric layer disposed above the metal fuse link is exposed.

Another example embodiment of the present invention is directed to a method for making a semiconductor device that includes a substrate, an insulative layer disposed on the substrate and a metal fuse link disposed on the insulative layer. A secondary insulative layer is provided over the metal fuse link and then a primary dielectric layer is provided over the secondary insulative layer. The primary dielectric layer is then chemically-mechanically polished to a predetermined thickness over the fuse link and is covered with an etch interrupting layer. The etch interrupting layer is covered with a secondary dielectric layer; the primary dielectric layer, the etch interrupting layer and the secondary dielectric layer forming a interlayer dielectric having a selected thickness that is greater than the predetermined thickness of the primary dielectric layer. A metal layer is formed above the interlayer dielectric and the layers over the etch interrupting layer and above the metal fuse link are removed. The etch interrupting layer and the primary dielectric layer above the fuse link are removed to expose a portion of the secondary insulative layer disposed above the metal fuse link.

Another example embodiment is directed to a method for making a semiconductor device that includes a substrate, an insulative layer disposed on the substrate and a metal fuse link disposed on the insulative layer. A primary dielectric layer is provided over the metal fuse link and the primary dielectric layer chemically-mechanically polished to a predetermined thickness over the fuse link. The primary dielectric layer is covered with an etch interrupting layer and the etch interrupting is then covered with a secondary dielectric layer. The etch interrupting layer and the secondary dielectric layer form an interlayer dielectric having a selected thickness that is greater than the predetermined thickness of the primary dielectric layer. A metal layer is formed above the interlayer dielectric and the layers over the etch interrupting layer and above the metal fuse link are then removed. Finally, the etch interrupting layer is removed to expose a portion of the primary dielectric layer disposed above the metal fuse link.

The above summary of the present invention is not intended to describe each possible embodiment or every implementation of the present invention. The figures, and the detailed description that follows, more particularly exemplify these embodiments.

DETAILED DESCRIPTION OF THE DRAWINGS

The invention may be more completely understood upon consideration of the following detailed description of various embodiments of the invention in connection with the accompanying drawings, in which.

Figure 1A:
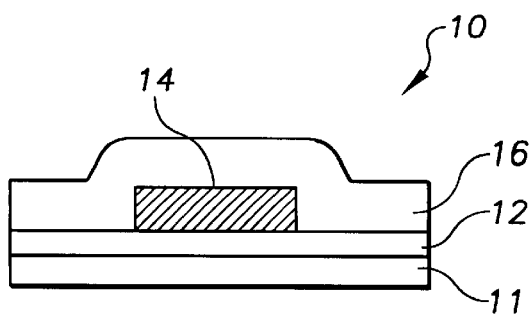
FIG. 1A illustrates an example embodiment of a semiconductor structure, made according to the teachings of the present invention, having a fuse link with a primary dielectric disposed thereon.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention has been found useful and advantageous in connection with the manufacture of fuses in semiconductor devices using conventional processing techniques. The present invention describes a method of removing the ILD (interlayer dielectric) over the fuse with some precision by first forming the oxide layer over the fuse with a necessary thickness, in relation to the wavelength of the laser light beam, before the other layers of the ILD are formed. This provides the advantage that selective etching can be used to remove the upper layers of the ILD until the oxide layer above the fuse is exposed. Further etching is not required since the thickness of the oxide layer was predetermined at the onset. While the present invention is not so limited, appreciation of various aspects of the invention is best gained through a discussion of various example semiconductor manufacturing methods and structures described below.

An example embodiment the present invention is directed to a method for making a semiconductor device that includes a substrate, an insulative layer disposed on the substrate and a metal fuse link disposed on the insulative layer. A primary dielectric layer is then provided over the metal fuse link, with the primary dielectric layer having a predetermined deposition thickness over the fuse link. The primary dielectric layer is then covered with an etch interrupting layer and the etch interrupting layer is then covered with a secondary dielectric layer. A portion of the secondary dielectric layer is then removed, and the etch interrupting layer and the remaining secondary dielectric layer form an interlayer dielectric having a selected thickness that is greater than the thickness of the primary dielectric layer. A metal layer is formed over the interlayer dielectric and then the layers over the etch interrupting layer and above the metal fuse link are removed. Finally, the etch interrupting layer over the primary dielectric layer is removed and a portion of the primary dielectric layer disposed above the metal fuse link is exposed.

Referring now to FIGS. 1A–1F, in FIG. 1A there is shown a semiconductor structure 10 that is disposed on a substrate 11. On substrate 11 is formed an insulative (oxide) layer 12 and a metal fuse link 14 that is disposed on insulative layer 12. The final shape of the fuse link determines how much current it can carry, the amount of energy required to open the fuse, and the long-term reliability of the fuse. For further information on manufacturing and testing fuses, reference is made to U.S. Pat. No. 4,455,194 to Yabu et al, "Method for Producing a Semiconductor Device," and to U.S. Pat. No. 4,628,590 to Udo et al, "Method of Manufacture of a Semiconductor Device;" both of which are herein incorporated by reference.

Referring to FIG. 1A, another oxide layer 16 is then disposed on oxide layer 12 and over fuse link 14. Oxide layer 16 can be made of a conformal oxide material and can be deposited through conventional deposition techniques at a predetermined or desired thickness. When using the conformal oxide, the thickness of the film will be determined by the wavelength of the laser beam that is used in the manufacturing process to open the fuse link.

Figure 1B:
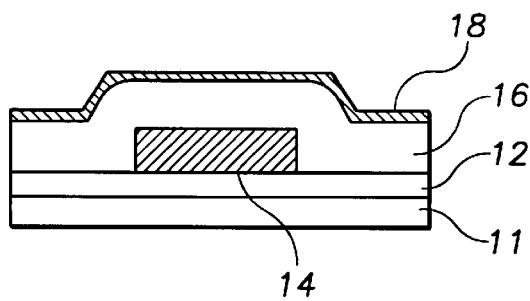
FIG. 1B illustrates the example embodiment of a semiconductor structure with an etch interrupting layer disposed on the primary dielectric.
Figure 1C:
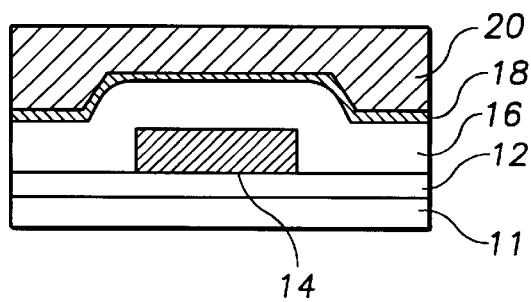
FIG. 1C illustrates the example embodiment of a semiconductor structure with a secondary dielectric layer that is formed over the etch interrupting layer.

Referring to FIG. 1B, an etch interrupting or etch stop layer 18 is formed over oxide layer 16. This is preferably made of nitride and is only a few hundred angstroms in thickness (500 Å–1000 Å). As shown in FIG. 1C, a chemically-mechanically polished (CMP) oxide layer 20 is formed over nitride layer 18 by depositing a layer of oxide material and subjecting it to a chemical-mechanical polish process. Layer 20 can be formed from another type of oxide material that is removable with another conventional etching process. These steps provide a total interlayer dielectric thickness (including thickness of layers 18 and 20) that is dependent on the technology of choice but is greater than the thickness of oxide layer 16 that is immediately disposed over fuse link 14.

Figure 1D:
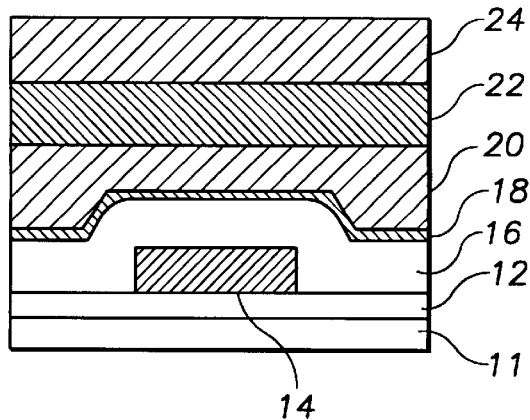
FIG. 1D illustrates the example embodiment of a semiconductor structure with a metal layer and a pasivation layer that are formed over the interlayer dielectric.

Referring to FIG. 1D, subsequent processing includes formation of metal layer 22 followed by via masking and etching of the metal layer. If more vias are desired, then another metal layer can be formed followed by another masking/etching operation. A passivation layer 24 is then deposited on metal layer 22, as shown in FIG. 1D. This passivation layer may be comprised of two layers, an oxide layer and nitride layer, for example, in the form of a sandwich.

Figure 1E:
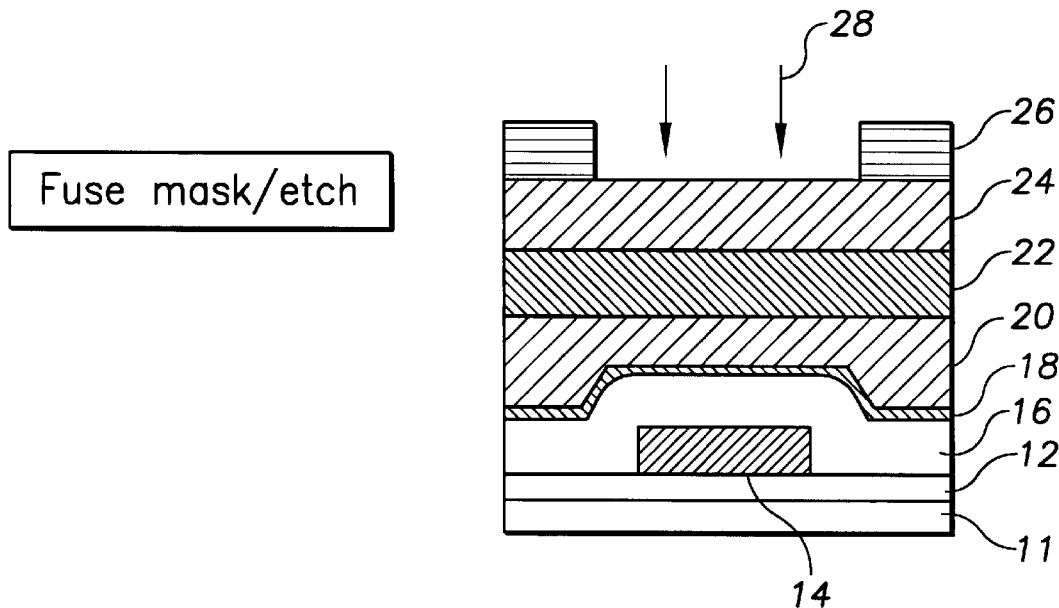
FIG. 1E illustrates the example embodiment of a semiconductor structure, with a masking layer on the passivation layer, that is subjected to an etching process.
Figure 1F:
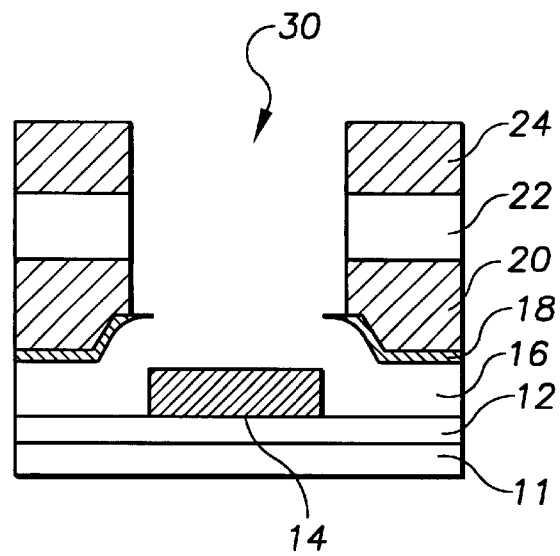
FIG. 1F illustrates the example embodiment of a semiconductor structure that has had the dielectric layers above the fuse etched away, leaving an exposed portion of the primary dielectric.

Referring to FIG. 1E, a fuse mask 26 is used to expose the fuse area of the underlying fuse link. As shown in FIGS. 1E and 1F, semiconductor structure 10 is subjected to an etch process 28 that etches through passivation layer 24 and then through a portion of the interlayer dielectric stack defined by layers 20 and 18. The etch process utilizes a chemical process that removes the oxide layers and leaves nitride layer 18 intact. As shown in FIG. 1F, etch process 28 forms an aperture 30 that continues down through the layers of structure 10 until nitride or stop layer 18 is exposed over fuse 14. The last step of etch process 28 utilizes a chemical process that removes nitride (stop layer 18) but preserves oxide layer 16, thereby exposing a portion of oxide layer 16 that is located over fuse 14. A laser can then be used to blow open fuse 14 knowing that oxide layer 16 has a thickness that can be pierced by the laser. The teachings of the present invention helped to form the oxide layer over the fuse with a sufficient thickness so as to encapsulate the fuse, but not so thick as to make it difficult for the laser to blow open the fuse. The selective etching process of the present invention promotes removal of the dielectric and insulative layers above the fuse link but leave the final protective layer over the fuse intact.

In another embodiment, the interlayer dielectric is formed by first depositing the oxide material layer and then using CMP to polish back the oxide material to form a protective layer (to the desired thickness) over fuse 14. The thickness of this oxide layer will be determined by the wavelength of the laser beam that is used in the manufacturing process to open the fuse link. The nitride layer is then deposited and finally the capping (oxide) layer 20 would be formed. In the above-described embodiments, the fuse mask opening will utilize a first etching process that etches the oxide layers above the nitride layer but preserves the nitride layer. Once oxide 20 has been etched away and the nitride stop layer 18 is exposed, then a second etch process is used that etches nitride material and preserves the oxide material, leaving the oxide layer with the desired thickness over fuse 14.

Figure 2A:
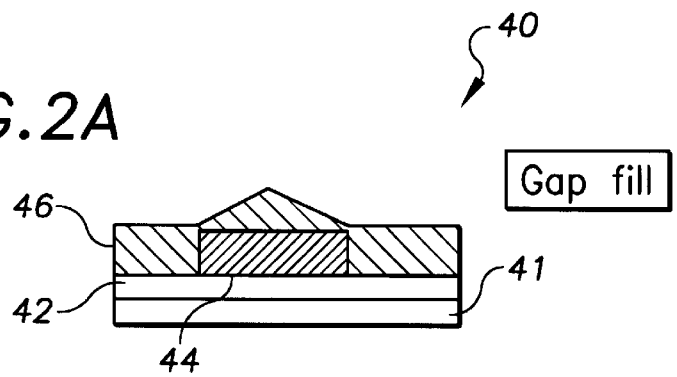
FIG. 2A illustrates an example embodiment of a semiconductor structure, made according to the teachings of the present invention, having a fuse link with a secondary insulative layer disposed thereon.

Referring now to FIGS. 2A–2F there is described another embodiment according to the teachings of the present invention. In FIG. 2A there is shown a semiconductor structure 40 that is disposed on a substrate 41. On substrate 41 is an oxide or insulative layer 42 and a metal fuse link 44 that is disposed on oxide layer 42. Another oxide layer 46 is disposed on oxide layer 42 and fuse link 44. Oxide layer 46 can be made of a gap fill oxide material such as HDP but should not be limited to this material.

Figure 2B:
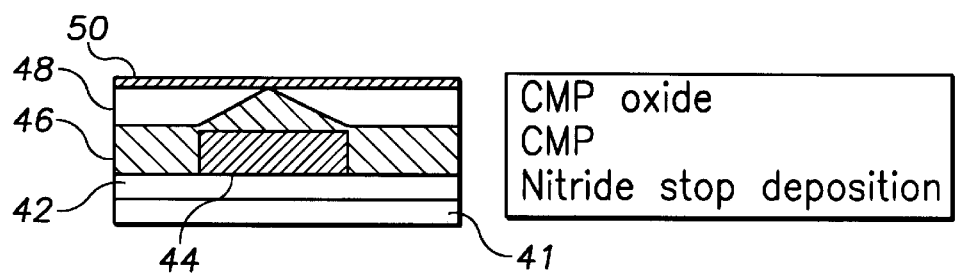
FIG. 2B illustrates the example embodiment of a semiconductor structure with a primary dielectric layer being disposed on the secondary insulative layer and further including an etch interrupting layer thereon.
Figure 2C:
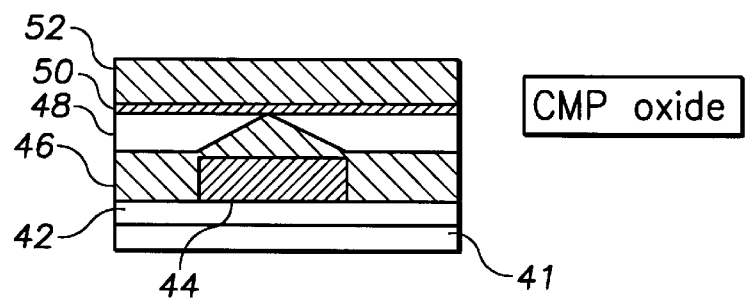
FIG. 2C illustrates the example embodiment of a semiconductor structure with a secondary dielectric layer that is formed over the etch interrupting layer.

Referring to FIG. 2B, a chemically-mechanically polished (CMP) oxide layer 48 is formed over oxide layer 46 by depositing an oxide material and polishing the material via the chemical-mechanical polish process. The CMP process can be programmed to form oxide layer 48 to the appropriate thickness, the thickness of the film to be determined by the wavelength of the laser beam that is used in the manufacturing process to open the fuse link. As shown in FIG. 2B, an etch interrupting or stop layer 50 is formed over oxide layer 48. This is preferably made of nitride and is only a few hundred angstroms in thickness (500Å–1000 Å). As shown in FIG. 2C, an oxide layer 52 (also known as a capping oxide) is formed over nitride layer 50 by depositing an oxide material and subjecting it to the chemical-mechanical polish process. This provides a total interlayer dielectric thickness (thickness that includes layers 48, 50 and 52) that is dependent on the technology of choice but is greater than the thickness of oxide layer 46 that is immediately disposed over fuse link 44.

Figure 2D:
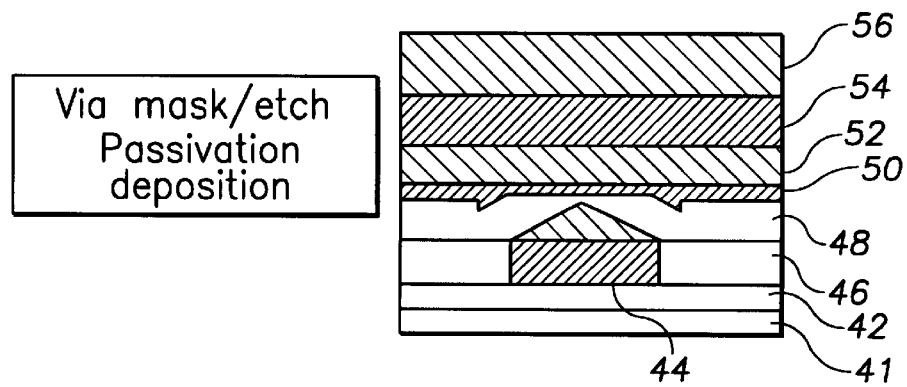
FIG. 2D illustrates the example embodiment of a semiconductor structure with a metal layer and a passivation layer that are formed over the interlayer dielectric.

Referring to FIG. 2D, subsequent processing includes formation of metal layer 54 followed by via masking and etching of the metal layer. If more vias are desired, then another metal layer can be formed followed by another masking/etching operation. A passivation layer 56 is then deposited on metal layer 54, as shown in FIG. 2D. This passivation layer may be comprised of two layers, an oxide layer and nitride layer, for example, in the form of a sandwich.

Figure 2E:
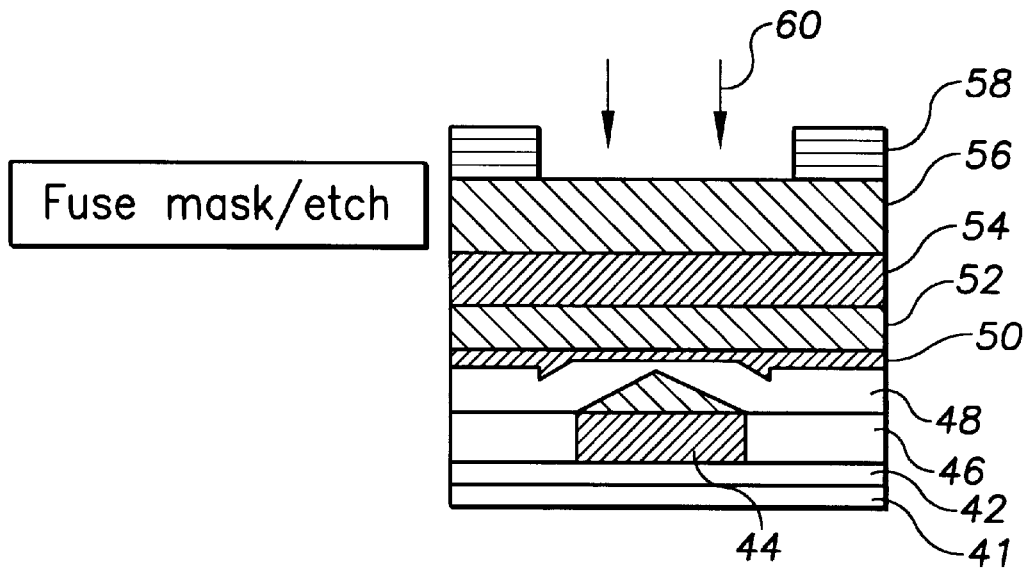
FIG. 2E illustrates the example embodiment of a semiconductor structure, with a masking layer on the passivation layer, that is subjected to an etching process.
Figure 2F:
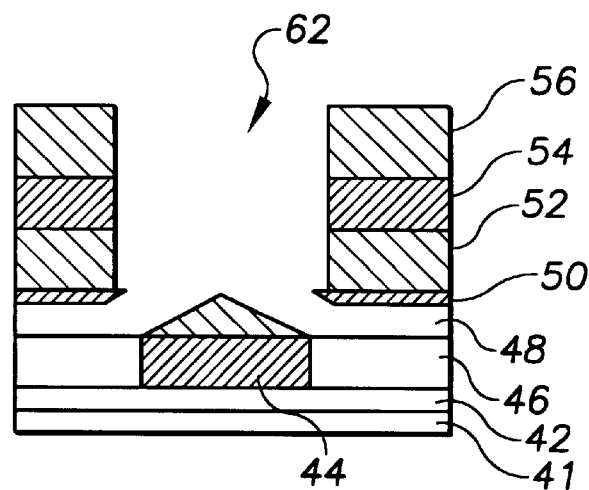
FIG. 2F illustrates the example embodiment of a semiconductor structure that has had the dielectric layers above the fuse etched away, leaving an exposed portion of the primary dielectric.

Referring to FIG. 2E, a fuse mask 58 is used to expose the fuse area of the underlying fuse metal. As shown in FIGS. 2E and 2F, semiconductor structure 40 is subjected to an etch process 60 that etches through passivation layer 56 and then through a portion of the interlayer dielectric stack defined by layers 48, 50 and 52. The etch process utilizes a chemical process that removes the oxide layers and leaves nitride layer 50 intact. As shown in FIG. 2F, etch process 60 forms an aperture 62 that continues down through the layers of structure 40 until nitride or stop layer 50 is exposed over fuse 44. The last step of etch process 60 utilizes a chemical process that removes nitride (stop layer 50) but preserves oxide layer 46, thereby exposing a portion of oxide layer 46 that is located over fuse 44. A laser can then be used to blow open fuse 44 knowing that oxide layer 46 has a thickness that can be pierced by the laser.

As noted above, the present invention is applicable to a number of different semiconductor structures and arrangements. Accordingly, the present invention should not be considered limited to the particular examples described above, but rather should be understood to cover all aspects of the invention as fairly set out in the attached claims. Various modifications, equivalent structures, as well as numerous structures to which the present invention may be applicable will be readily apparent to those of skill in the art upon review of the present specification. The claims are intended to cover such modifications and devices.

What is claimed is:

1. A method for making a semiconductor device, including a substrate, an insulative layer disposed on the substrate and a metal fuel link disposed on the insulative layer, comprising:
    providing a primary dielectric layer over the metal fuse link, the primary dielectric layer having a predetermined deposition thickness over the fuse link;
    covering the primary dielectric layer with an etch interrupting layer;
    covering the etch interrupting layer with a secondary dielectric layer;
    removing a portion of the secondary dielectric layer, the etch interrupting layer and the remaining secondary dielectric layer providing an interlayer dielectric having a selected thickness that is greater than the thickness of the primary dielectric layer;
    forming a metal layer over the interlayer dielectric; and
    removing the layers over the etch interrupting layer and above the metal fuse link, and removing the etch interrupting layer over the primary dielectric layer and exposing a portion of the primary dielectric layer disposed above the metal fuse link.

2. The method of making a semiconductor device according to claim 1, wherein the predetermined deposition thickness is determined by the wavelength of the laser light beam used to open the fuse link.

3. The method of making a semiconductor device according to claim 1, wherein removing the secondary dielectric layer is done by chemical-mechanical polishing.

4. The method of making a semiconductor device according to claim 2, further including providing a passivation layer disposed on the metal layer, the passivation layer comprised of two layers of differing insulative materials.

5. The method of making a semiconductor device according to claim 4, wherein the two layers include an oxide and a nitride material.

6. The method of making a semiconductor device according to claim 4, further providing a fuse making and etching process that will remove the passivation layers and a portion of the interlayer dielectric.

7. A semiconductor device manufactured according to the method of claim 1.

8. A method for making a semiconductor device, including a substrate, an insulative layer disposed on the substrate and a metal fuse link disposed on the insulative layer, comprising:
    providing a secondary insulative layer over the metal fuse link;
    providing a primary dielectric layer over the secondary insulative layer;
    chemically-mechanically polishing the primary dielectric layer to a predetermined thickness over the fuse link;
    covering the primary dielectric layer with an etch interrupting layer;
    covering the etch interrupting layer with a secondary dielectric layer, the primary dielectric layer, the etch interrupting layer and the secondary dielectric layer providing an interlayer dielectric having a selected thickness that is greater than the predetermined thickness of the primary dielectric layer;
    forming a metal layer above the interlayer dielectric; and
    removing the layers over the etch interrupting layer and above the metal fuse link, and removing the etch interrupting layer and the primary dielectric layer above the fuse link and exposing a portion of the secondary insulative layer disposed above the metal fuse link.

9. The method of making a semiconductor device according to claim 8, wherein the predetermined thickness of the primary dielectric layer is determined by the wavelength of the laser light beam used to open the fuse link.

10. The method of making a semiconductor device according to claim 8, wherein the secondary insulative material is a gap fill oxide.

11. The method of making a semiconductor device according to claim 10, wherein the gap fill oxide is HDP oxide.

12. The method of making a semiconductor device according to claim 8, wherein the primary dielectric layer is made of a conformal oxide material and the etch interrrupting layer is made of a nitride material.

13. The method of making a semiconductor device according to claim 9, further including providing a passivation layer disposed on the metal layer, the passivation layer comprised of two layers of differing insulative materials.

14. The method of making a semiconductor device according to claim 13, wherein the layers include an oxide and a nitride material.

15. The method of making a semiconductor device according to claim 13, further providing a fuse making and etching process that will remove the passivation layers and a portion of the interlayer dielectric.

16. A semiconductor device manufactured according to the method of claim 8.

17. A method for making a semiconductor device, including a substrate, an insulative layer disposed on the substrate and a metal fuse link disposed on the insulative layer, comprising:

providing a primary dielectric layer over the metal fuse link;

chemically-mechanically polishing the primary dielectric layer to a predetermined thickness over the fuse link;

covering the primary dielectric layer with an etch interrupting layer;

covering the etch interrupting layer with a secondary dielectric layer, the etch interrupting layer and the secondary dielectric layer providing an interlayer dielectric having a selected thickness that is greater than the predetermined thickness of the primary dielectric layer;

forming a metal layer above the interlayer dielectric; and removing the layers over the etch interrupting layer and above the metal fuse link, and removing the etch interrupting layer and exposing a portion of the primary dielectric layer disposed above the metal fuse link.

18. The method of making a semiconductor device according to claim 17, wherein the predetermined thickness of the primary dielectric layer is determined by the wavelength of the laser light beam used to open the fuse link.

19. The method of making a semiconductor device according to claim 17, wherein the primary dielectric layer is made of a conformal oxide material and the etch interrupting layer is made of a nitride material.

20. A semiconductor device made according to the method of claim 19.

* * * * *

UNITED STATES PATENT AND TRADEMARK OFFICE
CERTIFICATE OF CORRECTION

PATENT NO. : 6,306,746 B1  
DATED : October 23, 2001  
INVENTOR(S) : Haley et al.

Page 1 of 1

It is certified that error appears in the above-identified patent and that said Letters Patent is hereby corrected as shown below:

<u>Column 7,</u>  
Line 59, "fuel", should read -- fuse --.

Signed and Sealed this

Twenty-third Day of April, 2002

*Attest:*

JAMES E. ROGAN  
*Attesting Officer*  *Director of the United States Patent and Trademark Office*